(12) United States Patent
Achuthan et al.

(10) Patent No.: US 7,358,191 B1
(45) Date of Patent: Apr. 15, 2008

(54) METHOD FOR DECREASING SHEET RESISTIVITY VARIATIONS OF AN INTERCONNECT METAL LAYER

(75) Inventors: Krishnashree Achuthan, San Ramon, CA (US); Brad Davis, Santa Clara, CA (US); James Xie, San Jose, CA (US); Kashmir Sahota, Fremont, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 11/388,390

(22) Filed: Mar. 24, 2006

(51) Int. Cl.
*H01L 21/311* (2006.01)

(52) U.S. Cl. ............... 438/700; 438/618; 438/680; 257/E21; 257/17; 257/229; 257/304; 257/548

(58) Field of Classification Search ............ 438/700, 438/680, 618, 657, 706, 733, 692
See application file for complete search history.

(56) References Cited

U.S. PATENT DOCUMENTS

| | | | | |
|---|---|---|---|---|
| 4,740,480 A | * | 4/1988 | Ooka | 438/436 |
| 4,952,524 A | * | 8/1990 | Lee et al. | 438/437 |
| 5,229,315 A | * | 7/1993 | Jun et al. | 438/426 |
| 5,468,676 A | * | 11/1995 | Madan | 438/426 |
| 5,576,241 A | * | 11/1996 | Sakai | 438/404 |
| 5,868,870 A | * | 2/1999 | Fazan et al. | 148/33.3 |

* cited by examiner

*Primary Examiner*—David Nhu
(74) *Attorney, Agent, or Firm*—Farjami & Farjami LLP

(57) ABSTRACT

According to one exemplary embodiment, a method includes a step of forming a number of trenches in a dielectric layer, where the dielectric layer is situated over a wafer. The method further includes forming a metal layer over the dielectric layer and in the trenches such that the metal layer has a dome-shaped profile over the wafer. The method further includes performing a planarizing process to form a number of interconnect lines, where each of the interconnect lines is situated in one of the trenches. The dome-shaped profile of the metal layer causes the interconnect lines to have a reduced thickness variation across the wafer after performing the planarizing process. The interconnect lines are situated in an interconnect metal layer, where the dome-shaped profile of the metal layer causes the interconnect metal layer to have increased sheet resistivity uniformity across the wafer after performing the planarizing process.

19 Claims, 8 Drawing Sheets

METHOD FOR DECREASING SHEET RESISTIVITY VARIATIONS OF AN INTERCONNECT METAL LAYER

TECHNICAL FIELD

The present invention is generally in the field of fabrication of semiconductor devices. More specifically, the present invention is in the field of fabrication of interconnect metal lines in semiconductor devices.

BACKGROUND ART

Sheet resistivity can vary in an interconnect metal layer as a result of variations in trench width or trench depth that can occur during formation of interconnect lines. By way of background, sheet resistivity of an interconnect metal layer is measured in "ohms per square" of the interconnect surface. Variations in sheet resistivity of an interconnect metal layer, such as a first interconnect metal layer (i.e. "M1") of a semiconductor wafer, can undesirably reduce the manufacturing yield of semiconductor devices, such as memory and logic devices.

In a conventional fabrication process, interconnect lines in a semiconductor device, such as a memory device, can be formed by patterning and etching trenches in a dielectric layer situated over a semiconductor wafer. A plating process can then be used to deposit a metal, such as copper, in the trenches and over the dielectric layer. A chemical mechanical polishing (CMP) process is typically used to remove excess metal over the trenches and form interconnect lines in the trenches. However, since temperature is higher at the center of the wafer compared to the edges of the wafer during the CMP process, more metal is removed in the center of the wafer than at the edges of the wafer. As a result, the thickness of the interconnect lines can vary significantly across the wafer, which can cause undesirable variations in sheet resistivity of the interconnect metal layer.

Thus, there is a need in the art for a method for reducing variations in sheet resistivity of an interconnect metal layer fabricated over a semiconductor wafer.

SUMMARY

The present invention is directed to a method for decreasing sheet resistivity variations of an interconnect metal layer. The present invention addresses and resolves the need in the art for a method for reducing variations in sheet resistivity of an interconnect metal layer fabricated over a semiconductor wafer.

According to one exemplary embodiment, a method includes a step of forming a number of trenches in a dielectric layer, where the dielectric layer is situated over a wafer. The method further includes forming a metal layer over the dielectric layer and in the trenches such that the metal layer has a dome-shaped profile over the wafer. The metal layer can be copper, for example. The metal layer can be formed, for example, by using a plating process to deposit said metal layer. The plating process can use a number of virtual concentric electrodes situated adjacent to the wafer, where a current flow in each of the virtual concentric electrodes can be controlled to cause the metal layer to be deposited with the dome-shaped profile. The metal layer can have a first thickness over the dielectric layer over an approximate center of the wafer and a second thickness over the dielectric layer at an edge of the wafer, where the first thickness is greater than the second thickness. For example, the first thickness can be between 500.0 Angstroms and 3000.0 Angstroms greater than the second thickness or vice-versa.

According to this embodiment, the method further includes performing a planarizing process to form a number of interconnect lines, where each of the interconnect lines is situated in one of the trenches. The planarizing process can be a chemical mechanical polishing process, for example. The dome-shaped profile of the metal layer causes the dielectric layer to have a substantially planar top surface after performing the planarizing process and causes the interconnect lines to have a reduced thickness variation across the wafer. The interconnect lines are situated in an interconnect metal layer, where the dome-shaped profile of the metal layer causes the interconnect metal layer to have increased sheet resistivity uniformity across the wafer after performing the planarizing process. Other features and advantages of the present invention will become more readily apparent to those of ordinary skill in the art after reviewing the following detailed description and accompanying drawings.

DETAILED DESCRIPTION OF THE INVENTION

The present invention is directed to a method for reducing variations in sheet resistivity of an interconnect metal layer. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

Figure 1A:
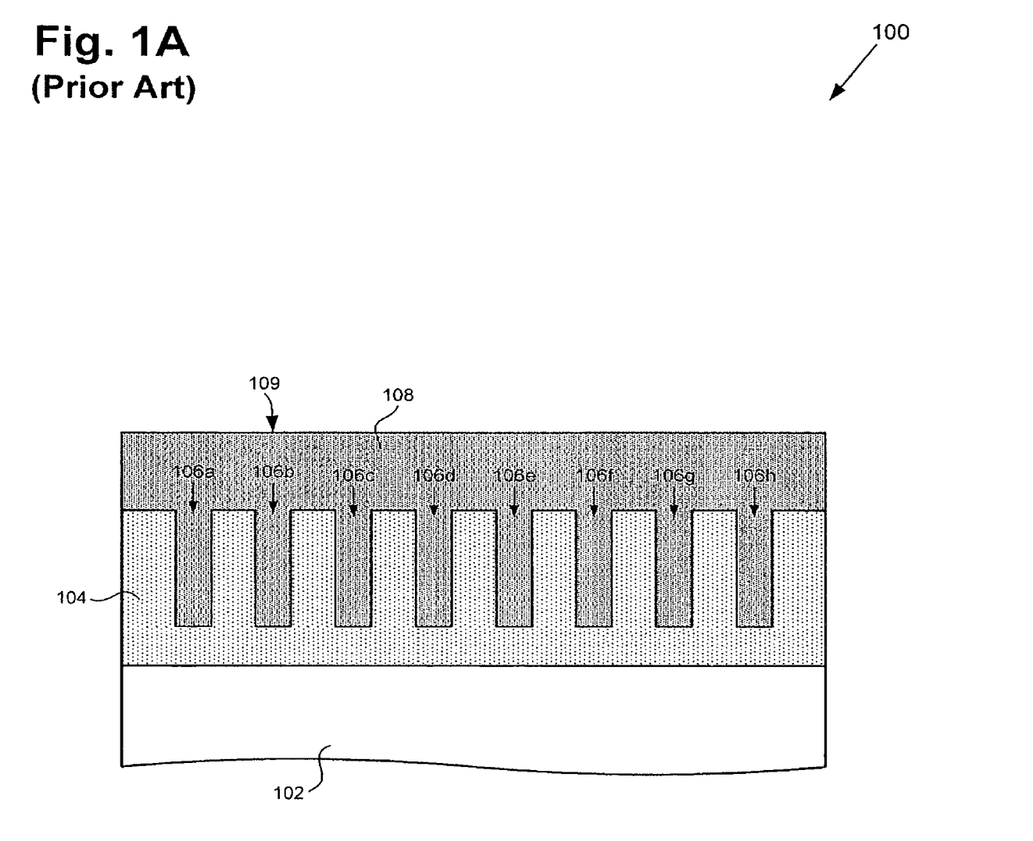
FIG. 1A illustrates a cross-section view of a structure corresponding to an intermediate step of an exemplary conventional process for fabricating interconnect lines.

FIG. 1A shows a cross-sectional view of an exemplary structure corresponding to an intermediate step of an exemplary conventional process for interconnect line fabrication. Structure 100 includes wafer 102, dielectric layer 104, trenches 106a, 106b, 106c, 106d, 106e, 106f, 106g, and 106h (hereinafter "trenches 106a through 106h), and metal layer 108.

As shown in FIG. 1A, dielectric layer 104 is situated over wafer 102 and can comprise a dielectric material having a low dielectric constant (low-k) or other suitable dielectric material. Wafer 102 can comprise a semiconductor material, such as silicon. Dielectric layer 104 can be formed over wafer 102 by using a chemical vapor deposition (CVD) process or other suitable deposition processes. Also shown in FIG. 1A, trenches 106a through 106h are situated in dielectric layer 104. Trenches 106a through 106h can be formed in dielectric layer 104 by using a dry etch process or other suitable etch process. Further shown in FIG. 1A, metal layer 108 is situated over dielectric layer 104 and in trenches 106a through 106h and can comprise copper or other suitable metal. Metal layer 108 can be formed by using a plating process or other suitable deposition processes to deposit a metal, such as copper, over dielectric layer 104 and in trenches 106a through 106h. Depending on the particular deposition process used to form metal layer 108, top surface 109 of metal layer 108 can be substantially planar over wafer 102.

Figure 1B:
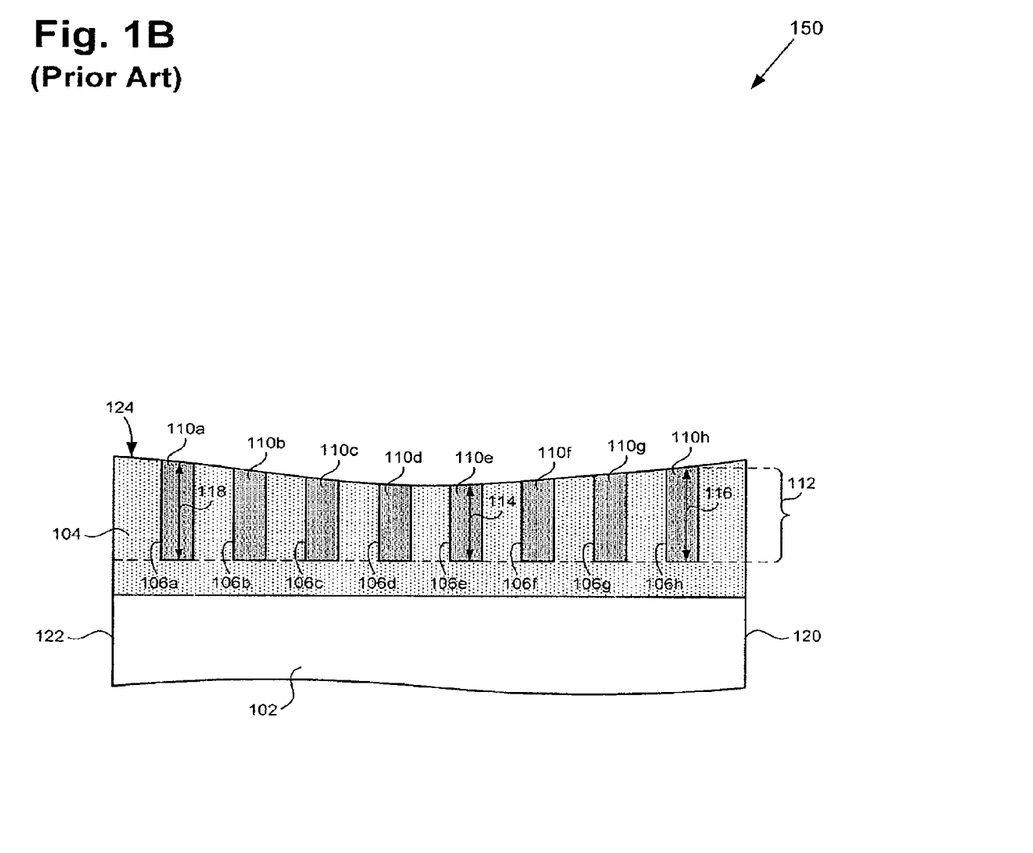
FIG. 1B illustrates a cross-section view of the structure in FIG. 1A after completion of a CMP process.

FIG. 1B shows a cross-sectional view of structure 150, which represents structure 100 in FIG. 1A after performance of a CMP process. In particular, wafer 102 and dielectric layer 104 correspond to the same elements in FIG. 1A and FIG. 1B. Structure 150 includes wafer 102, dielectric layer 104, and interconnect lines 110a, 110b, 110c, 110d, 110e, 110f, 110g, and 110h (hereinafter "interconnect lines 110a through 110h").

As shown in FIG. 1B, interconnect lines 110a through 110h are situated in dielectric layer 104 and also situated in interconnect metal layer 112, which can be, for example, interconnect metal layer one, also referred to as "M1." Interconnect lines 110a through 110h can be formed in respective trenches 106a through 106h by performing a CMP process on structure 100 in FIG. 1A to remove portions of metal layer 108 (shown in FIG. 1A) situated over trenches 106a through 106h and over dielectric layer 104. However, as a result of an inherent non-uniformity of the CMP process, the thicknesses of interconnect lines 110a through 110h vary across wafer 102. For example, thickness 114 of interconnect line 110e, which is situated over the approximate center of wafer 102, is less than thickness 116 of interconnect line 110h or thickness 118 of interconnect line 110a, which are situated close to respective edges 120 and 122 of wafer 102. The variation in the thicknesses of interconnect lines 110a through 110h caused by the inherent non-uniformity of the CMP process across wafer 102 causes a significant, undesirable variation in the sheet resistivity of interconnect metal layer 112, which can decrease manufacturing yield and device performance. Also, as a result of the CMP process, top surface 124 over dielectric layer 104 and interconnect lines 110a through 110h has a concave-shaped profile over the center of wafer 102 and, therefore, is not planar over wafer 102.

Figure 2:
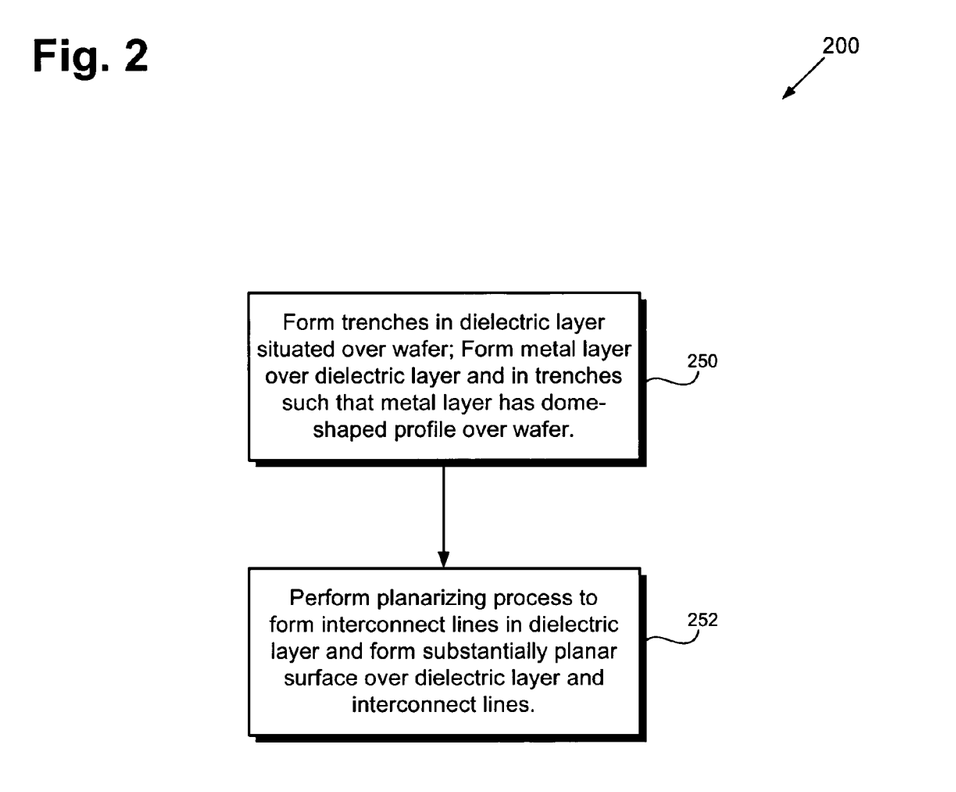
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 250 and 252 indicated in flowchart 200 are sufficient to describe one embodiment of the present invention; other embodiments of the invention may utilize steps different from those shown in flowchart 200.

Figure 3A:
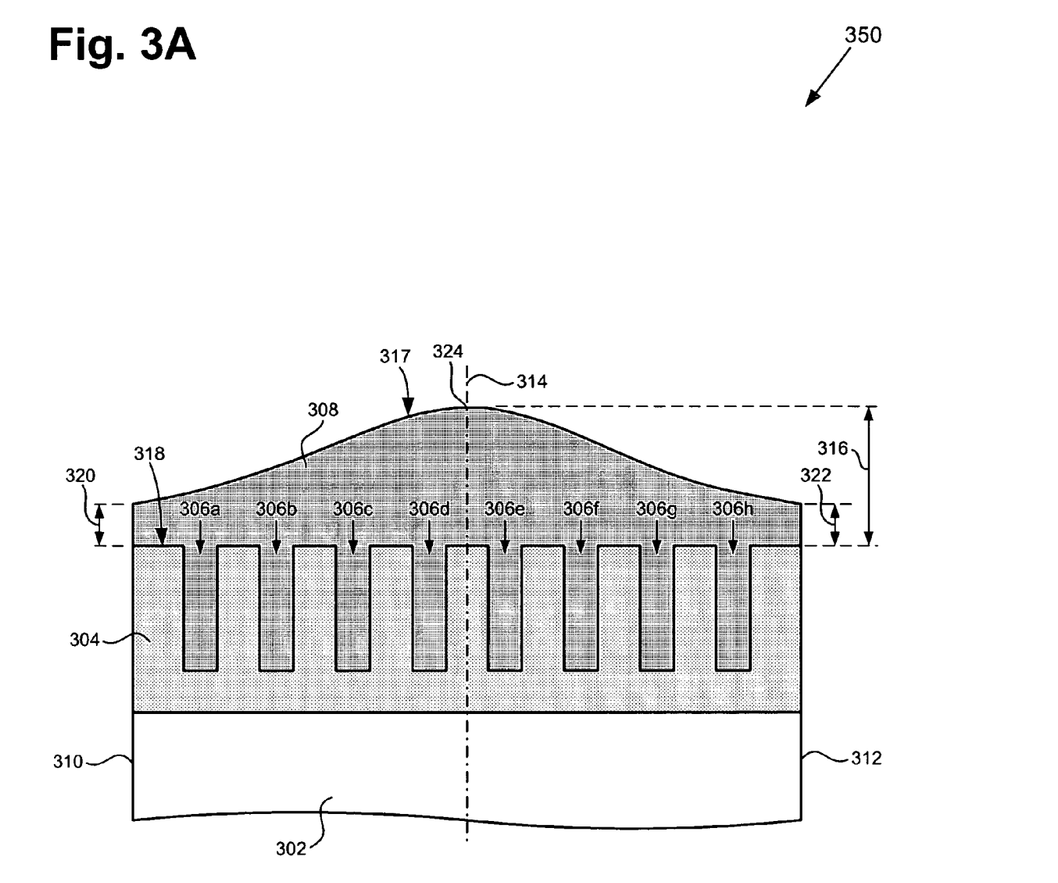
FIG. 3A illustrates a cross-sectional view, which includes a portion of a wafer processed according to an embodiment of the invention, corresponding to an initial step in the flowchart in FIG. 2.
Figure 3B:
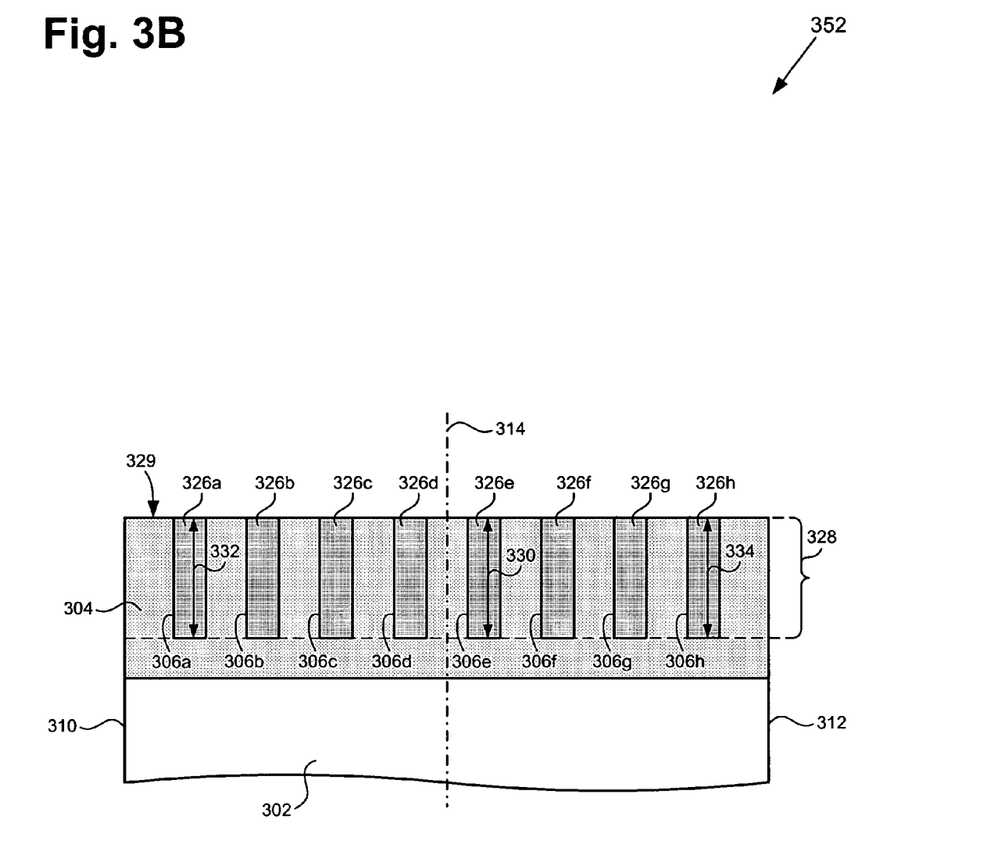
FIG. 3B illustrates a cross-sectional view, which includes a portion of a wafer processed according to an embodiment of the invention, corresponding to a final step in the flowchart in FIG. 2.

Moreover, structures 350 and 352 in FIGS. 3A and 3B illustrate the result of performing steps 250 and 252 of flowchart 200, respectively. For example, structure 350 shows a semiconductor structure after processing step 250 and structure 352 shows structure 350 after the processing of step 252. It is noted that although interconnect metal layer one (i.e. M1) is used to illustrate the invention, the present invention can be utilized to advantageously reduce sheet resistivity variations in any interconnect metal layer situated over a wafer.

Referring now to step 250 in FIG. 2 and structure 350 in FIG. 3A, at step 250 of flowchart 200, trenches 306a, 306b, 306c, 306d, 306e, 306f, 306g, and 306h (hereinafter "trenches 306a through 306h") are formed in dielectric layer 304 and metal layer 308 is formed over dielectric layer 304 and in trenches 306a through 306h such that metal layer 308 has a dome-shaped profile over wafer 302. As shown in FIG. 3A, dielectric layer 304 is situated over wafer 302, which can comprise silicon or other suitable semiconductor material and includes edges 310 and 312. Dielectric layer 304 can comprise silicon oxide, a low-k dielectric material, or other suitable dielectric material and can be formed over wafer 302 by using a CVD process or other suitable deposition processes.

Also shown in FIG. 3A, trenches 306a through 306h are situated in dielectric layer 304. Trenches 306a through 306h can be formed in dielectric layer 304 by using a photolithographic process to pattern respective openings on dielectric layer 304 and using a suitable etch process, such as a dry etch process, to etch the openings in dielectric layer 304. Further shown in FIG. 3A, metal layer 308 is situated over dielectric layer 304 and situated in trenches 306a through 306h and can comprise copper or other suitable metal. In the present embodiment, metal layer 308 has a dome-shaped profile (i.e. a convex dome-shaped profile) over wafer 302 such that the thickness of metal layer 308 over the center of wafer 302, which is indicated by centerline 314, is greater than the thickness of metal layer 308 at edges 310 and 312 of wafer 302. In another embodiment, metal layer 308 can have a dome-shaped profile over wafer 302 that is concave, wherein the thickness of metal layer 308 over the center of wafer 302 is less than the thickness of metal layer 308 at edges 310 and 312 of wafer 302.

Metal layer 308 has thickness 316 (as measured between top surface 318 of dielectric layer 304 and top surface 317 of metal layer 308) over the approximate center of wafer 302 and thicknesses 320 and 322 (as measured between top surface 318 of dielectric layer 304 and top surface 317 of metal layer 308) at respective edges 310 and 312 of wafer 302. In the present embodiment, thickness 316 can be greater than thicknesses 320 and 322 by between 100.0 Angstroms and 4000.0 Angstroms, for example. Thus, metal layer 308 decreases in thickness between apex 324 of metal layer 308, which is situated over the approximate center of wafer 302, and edges 310 and 312 of wafer 302. In an embodiment where metal layer 308 has a concave dome-shaped profile over wafer 302, thicknesses 320 and 322 can be greater than thickness 316 by between 100.0 Angstroms and 4000.0 Angstroms, for example. In that embodiment, metal layer 308 can increase in thickness between the approximate center of wafer 302 and edges 310 and 312.

Metal layer 308 can be formed by depositing a metal, such as copper, over dielectric layer 304 and in trenches 306a through 306h by using a plating process, such as an electroplating process. In the plating process, wafer 302 can be situated adjacent to a number of virtual concentric anodes, which are situated in a radial arrangement in a plating chamber. By appropriately controlling current flow through each of the concentric anodes, the metal deposition rate can be controlled in corresponding concentric areas over wafer 302 so as to control the thickness of the metal layer and, thereby, achieve a metal layer having a dome-shaped profile. The result of step 250 of flowchart 200 is illustrated by structure 350 in FIG. 3A.

Referring to step 252 in FIG. 2 and structure 352 in FIG. 3B, at step 252 of flowchart 200, a planarizing process is performed to form interconnect lines 326a, 326b, 326c, 326d, 326e, 326f, 326g, and 326h (hereinafter "interconnect lines 326a through 326h") and form substantially planar top surface 329 over dielectric layer 204 and interconnect lines 326a through 326h. As shown in FIG. 3B, interconnect lines 326a through 326h are situated in respective trenches 306a through 306h in dielectric layer 304. Interconnect lines 326a through 326h, which can comprise copper or other suitable metal, are also situated in interconnect metal layer 328, which can be, for example, interconnect metal layer one (i.e. M1, the first interconnect metal layer situated over wafer 302).

Interconnect lines 326a through 326h can be formed in respective trenches 306a through 306h by performing a CMP process on structure 350 in FIG. 3A to remove portions of metal layer 308 (shown in FIG. 3A) situated over trenches 306a through 306h and over dielectric layer 304. The CMP process also achieves a substantially planar top surface (i.e. top surface 329) over dielectric layer 304 and interconnect lines 326a through 326h. Thus, dielectric layer 304 and interconnect lines 326a through 326h have substantially planar top surfaces after performance of the CMP process. By way of background, the CMP process is inherently non-uniform over a wafer because, for example, the temperature is higher at the center of the wafer than at the edges of the wafer during the CMP process. As a result, during a conventional interconnect line formation process, as shown in FIGS. 1A and 1B, top surface 124 is not substantially planar over dielectric layer 104 and interconnect lines 110a through 110h after a CMP process has been performed.

However, in the embodiment of the invention in FIGS. 2, 3A, and 3B, metal layer 308 (shown in FIG. 3A) is formed such that metal layer 308 has a dome-shaped profile over wafer 302, which increases the thickness of metal layer 308 over the center of wafer 302 compared to the thickness of metal layer 308 over edges 310 and 312 of wafer 302. As a result of the dome-shaped profile of metal layer 308, the CMP process that is used to form interconnect lines 326a through 326h results in a substantially planar top surface (i.e. top surface 329) being formed over dielectric layer 304 and interconnect lines 326a through 326h. As a result, variations in thickness of interconnect lines 326a through 326h are significantly reduced. Thus, thickness 330 of interconnect line 326e, which is situated over the approximate center of wafer 302, can be approximately equal to thicknesses 332 and 334 of interconnect lines 326a and 326h, which are situated at respective edges 310 and 312 of wafer 302. In contrast, in the conventional interconnect line fabrication process in FIGS. 1A and 1B, the thicknesses of interconnect lines 110a through 110h significantly vary across wafer 102.

Thus, by forming a metal layer having a dome-shaped profile and using a CMP process to form interconnect lines in trenches formed in a dielectric layer, the embodiment of the invention in FIGS. 2, 3A, and 3B advantageously achieves interconnect lines having increased thickness uniformity compared to the conventional interconnect line fabrication process in FIGS. 1A and 1B. By forming interconnect lines 326a through 326h having increased thickness uniformity over wafer 302, the embodiment of the invention in FIGS. 2, 3A, and 3B advantageously achieves reduced variations in sheet resistivity (i.e. increased sheet resistivity uniformity) of interconnect metal layer 328 over wafer 302, which advantageously achieves an increased manufacturing yield and device performance.

Figure 4:
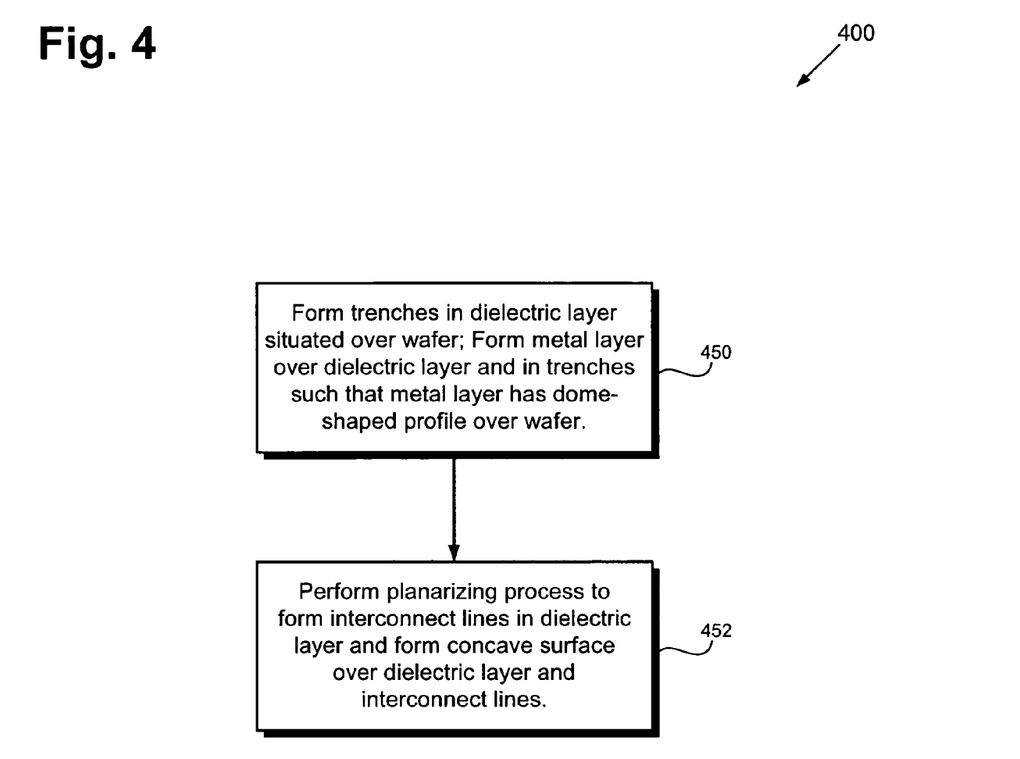
FIG. 4 shows a flowchart illustrating the steps taken to implement an embodiment of the present invention.
Figure 5A:
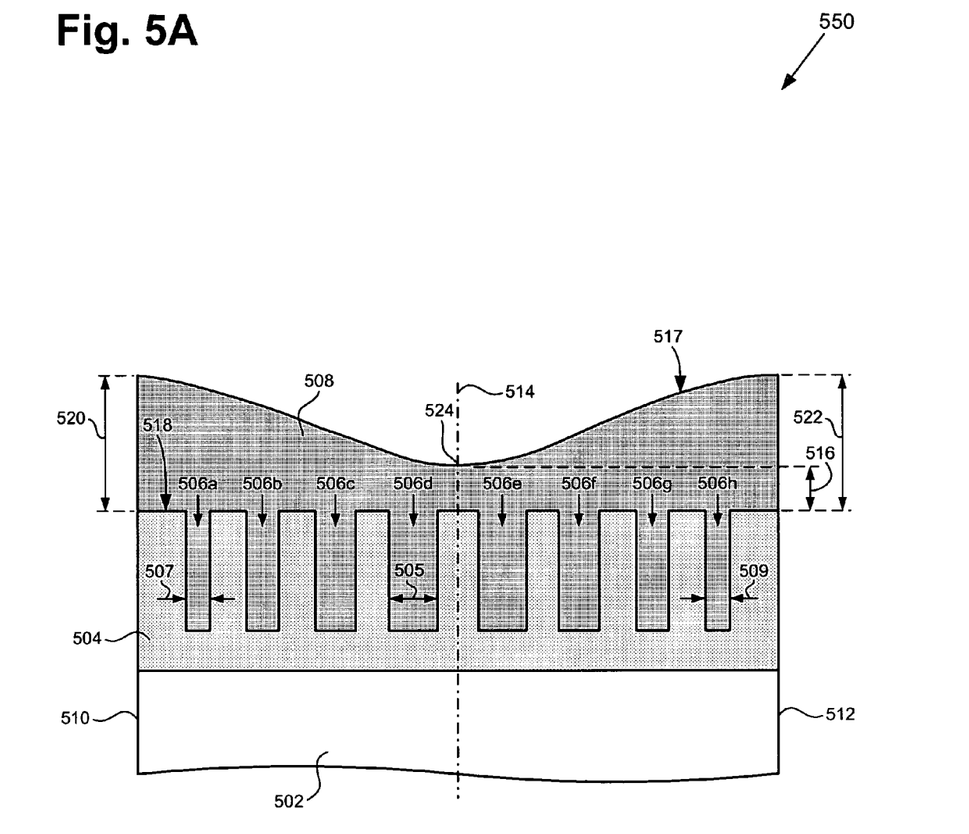
FIG. 5A illustrates a cross-sectional view, which includes a portion of a wafer processed according to an embodiment of the invention, corresponding to an initial step in the flowchart in FIG. 4.
Figure 5B:
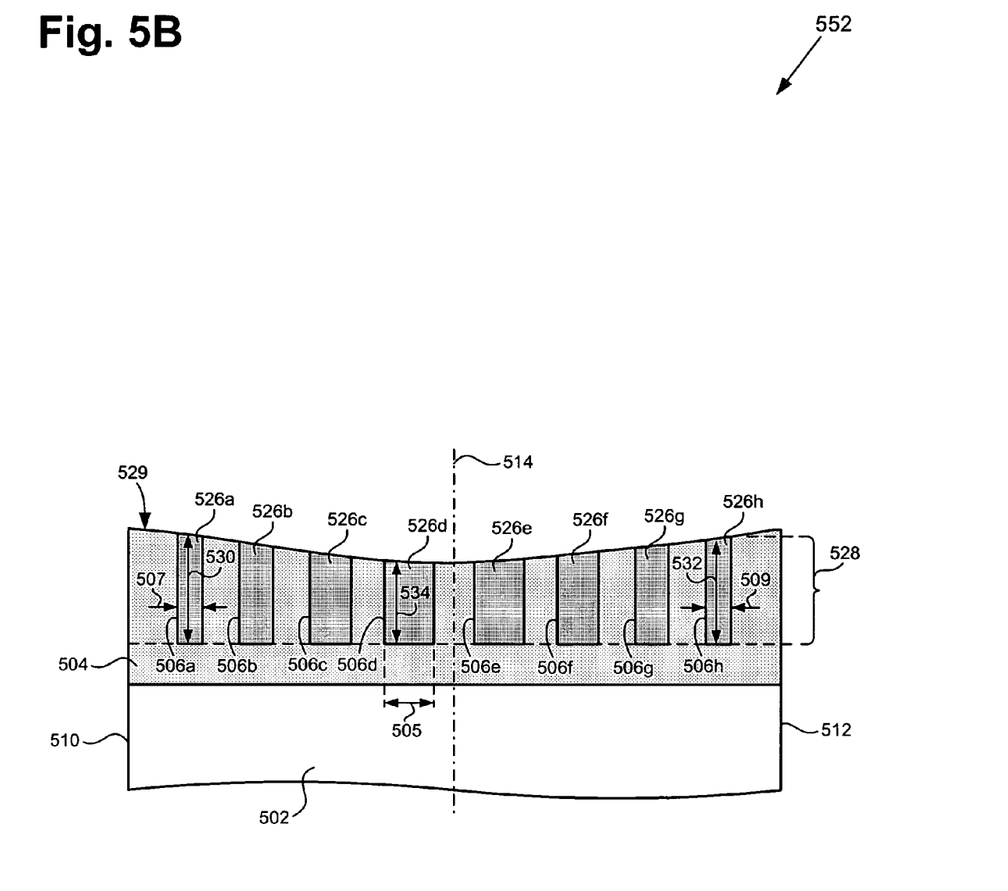
FIG. 5B illustrates a cross-sectional view, which includes a portion of a wafer processed according to an embodiment of the invention, corresponding to a final step in the flowchart in FIG. 4.

FIG. 4 shows a flowchart illustrating an exemplary method according to an embodiment of the present invention. Certain details and features have been left out of flowchart 400 that are apparent to a person of ordinary skill in the art. For example, a step may consist of one or more substeps or may involve specialized equipment or materials, as known in the art. Steps 450 and 452 indicated in flowchart 400 are sufficient to describe one embodiment of the present invention; other embodiments of the invention may utilize steps different from those shown in flowchart 400. Moreover, structures 550 and 552 in FIGS. 5A and 5B illustrate the result of performing steps 450 and 452 of flowchart 400, respectively. For example, structure 550 shows a semiconductor structure after processing step 450 and structure 552 shows structure 550 after the processing of step 452.

Referring now to step 450 in FIG. 2 and structure 450 in FIG. 5A, at step 450 of flowchart 400, trenches 506a, 506b, 506c, 506d, 506e, 506f, 506g, and 506h (hereinafter "trenches 506a through 506h") are formed in dielectric layer 504 and metal layer 508 is formed over dielectric layer 504 and in trenches 506a through 506h such that metal layer 508 has a dome-shaped profile over wafer 502, where top surface 517 of metal layer 508 is concave. As shown in FIG. 5A, dielectric layer 504 is situated over wafer 502, which can comprise silicon or other suitable semiconductor material and includes edges 510 and 512. Dielectric layer 504 can comprise silicon oxide, a low-k dielectric material, or other suitable dielectric material and can be formed over wafer 502 by using a CVD process or other suitable deposition processes.

Also shown in FIG. 5A, trenches 506a through 506h are situated in dielectric layer 504. Trenches 506a through 506h can be formed in dielectric layer 504 by using a photolithographic process to pattern respective openings on dielectric layer 504 and using a suitable etch process, such as a dry etch process, to etch the openings in dielectric layer 504. Due to inherent problems with patterning and etching critical dimensions, trenches 506a through 506h may have varying widths across wafer 502. For example, small variations in trench widths from the center of wafer 502, which is indicated by centerline 514, to edges 510 and 512 of wafer 502 can occur. Thus, width 505 of trench 506d, which is situated near the center of wafer 502, is larger than widths 507 and 509 of respective trenches 506a and 506h, which are situated near edges 510 and 512 of wafer 502. It is also possible that trench widths are wider at edges of the wafer relative to trench widths near the center of the wafer.

Further shown in FIG. 5A, metal layer 508 is situated over dielectric layer 504 and situated in trenches 506a through 506h and can comprise copper or other suitable metal. In the present embodiment, metal layer 508 has a dome-shaped profile (i.e. a concave dome-shaped profile) over wafer 502 such that the thickness of metal layer 508 over the center of wafer 502 is less than the thickness of metal layer 508 at edges 510 and 512 of wafer 502. Metal layer 508 has thickness 516 (as measured between top surface 518 of dielectric layer 504 and top surface 517 of metal layer 508) over the approximate center of wafer 302 and thicknesses 520 and 522 (as measured between top surface 518 of dielectric layer 504 and top surface 517 of metal layer 508) at respective edges 510 and 512 of wafer 502. In the present embodiment, thicknesses 520 and 522 can be greater than thickness 516 by between 100.0 Angstroms and 4000.0 Angstroms, for example. Thus, metal layer 508 increases in thickness between nadir 524 of metal layer 508, which is situated over the approximate center of wafer 502, and edges 510 and 512 of wafer 502.

Metal layer 508 can be formed by depositing a metal, such as copper, over dielectric layer 504 and in trenches 506a through 506h by using a plating process, such as an electroplating process. In the plating process, wafer 502 can be situated adjacent to a number of virtual concentric anodes, which are situated in a radial arrangement in a plating chamber. By appropriately controlling current flow through each of the concentric anodes, the metal deposition rate can be controlled in corresponding concentric areas over wafer 502 so as to control the thickness of the metal layer and, thereby, achieve a metal layer having a dome-shaped profile with a concave top surface. The result of step 450 of flowchart 400 is illustrated by structure 550 in FIG. 5A.

Referring to step 452 in FIG. 4 and structure 552 in FIG. 5B, at step 452 of flowchart 400, a planarizing process is performed to form interconnect lines 526a, 526b, 526c, 526d, 526e, 526f, 526g, and 526h (hereinafter "interconnect lines 526a through 526h") and form a concave top surface 529 over dielectric layer 504 and interconnect lines 526a through 526h. As shown in FIG. 5B, interconnect lines 526a through 526h are situated in respective trenches 506a through 506h in dielectric layer 504. Interconnect lines 526a through 526h, which can comprise copper or other suitable metal, are also situated in interconnect metal layer 528, which can be, for example, interconnect metal layer one (i.e. M1, the first interconnect metal layer situated over wafer 502).

Interconnect lines 526a through 526h can be formed in respective trenches 506a through 506h by performing a CMP process on structure 550 in FIG. 5A to remove portions of metal layer 508 (shown in FIG. 5A) situated over trenches 506a through 506h and over dielectric layer 504. The CMP process also achieves a concave top surface (i.e. top surface 529) over dielectric layer 504 and interconnect lines 526a through 526h such that interconnect lines situated near edges 510 and 512 of wafer 502 have a greater thickness than interconnect lines situated near the center of wafer 502. Thus, thicknesses 530 and 532 of respective interconnect lines 526a and 526h, which are situated near edges 510 and 512 of wafer 502, are greater than thickness 534 of interconnect line 526d, which is situated near the center of wafer 502.

Thus, in the embodiment of the invention in FIGS. 4, 5A, and 5B, metal layer 508 (shown in FIG. 5A) is formed such that metal layer 508 has a concave dome-shaped profile over wafer 502, which increases the thickness of metal layer 508 over edges 510 and 512 of wafer 502 compared to the thickness of metal layer 508 over the center of wafer 302. As a result of the concave dome-shaped profile of metal layer 508, the CMP process that is used to form interconnect lines 526a through 526h results in a concave top surface (i.e. top surface 529) being formed over dielectric layer 504 and interconnect lines 526a through 526h. Thus, wider interconnect lines (i.e. interconnect lines formed in wider trenches) situated near the center of wafer 502 have a smaller height than narrower interconnect lines (i.e. interconnect lines formed in narrower trenches) situated near edges 510 and 512 of wafer 502 such that each interconnect line has an approximately equal cross-sectional area.

Thus, the embodiment of the invention in FIGS. 4, 5A, and 5B advantageously reduces variations in sheet resistivity of interconnect metal layer 528 over wafer 502 caused by trench width (i.e. critical dimension) variations across the wafer. Thus, by reducing variations in sheet resistivity of an interconnect metal layer caused by variations in trench width across the wafer, the embodiment of the invention in FIGS. 4, 5A, and 5B also advantageously achieves increased manufacturing yield and device performance.

Thus, as discussed above, by utilizing a metal layer having a dome-shaped profile to advantageously reducing variations in sheet resistivity of an interconnect metal layer across a wafer caused by CMP process non-uniformity and variations in trench critical dimension (i.e. trench width), the respective embodiments of the invention in FIGS. 2, 3A, and 3B and FIGS. 4, 5A, and 5B advantageously achieve increased manufacturing yield.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for reducing variations in sheet resistivity of an interconnect metal layer has been described.

The invention claimed is:

1. A method comprising steps of:
   forming a plurality of trenches in a dielectric layer situated over a wafer;
   forming a metal layer over said dielectric layer and in said plurality of trenches such that said metal layer has a dome-shaped profile over said wafer;
   performing a planarizing process to form a plurality of interconnect lines, each of said plurality of interconnect lines being situated in one of said plurality of trenches, said plurality of interconnect lines being situated in an interconnect metal layer;
   wherein said dome-shaped profile of said metal layer causes said interconnect metal layer to have increased sheet resistivity uniformity across said wafer after said step of performing said planarizing process.

2. The method of claim 1 wherein said dome-shaped profile of said metal layer causes said dielectric layer to have a substantially planar top surface after said step of performing said planarizing process.

3. The method of claim 1 wherein said dome-shaped profile of said metal layer causes said plurality of interconnect lines to have a reduced thickness variation across said wafer.

4. The method of claim 1 wherein said metal layer has a first thickness over said dielectric layer over an approximate center of said wafer and a second thickness over said dielectric layer at an edge of said wafer, wherein said first thickness is greater than said second thickness.

5. The method of claim 4 wherein said first thickness is between 500.0 Angstroms and 3000.0 Angstroms greater than said second thickness.

6. The method of claim 1 wherein an apex of said metal layer is situated over an approximate center of said wafer.

7. The method of claim 1 wherein said planarizing process comprises a chemical mechanical polishing process.

8. The method of claim 1 wherein said metal layer comprises copper.

9. The method of claim 1 wherein said step of forming said metal layer comprises using a plating process to deposit said metal layer.

10. The method of claim 9 wherein said plating process uses a plurality of virtual concentric electrodes situated adjacent to said wafer, wherein a current flow in each of said plurality of virtual concentric electrodes is controlled to cause said metal layer to be deposited with said dome-shaped profile.

11. A method comprising steps of:
   forming a plurality of trenches in a dielectric layer, said dielectric layer being situated over a wafer;
   forming a metal layer over said dielectric layer and in said plurality of trenches such that said metal layer has a dome-shaped profile over said wafer;
   performing a planarizing process to form a plurality of interconnect lines, wherein each of said plurality of interconnect lines are situated in one of said plurality of trenches, wherein said dome-shaped profile of said metal layer causes said plurality of interconnect lines to have a reduced thickness variation across said wafer.

12. The method of claim 11 wherein said dome-shaped profile of said metal layer causes said dielectric layer to have a substantially planar top surface after said step of performing said planarizing process.

13. The method of claim 11 wherein said plurality of interconnect lines are situated in an interconnect metal layer, wherein said dome-shaped profile of said metal layer causes said interconnect metal layer to have increased sheet resistivity uniformity across said wafer after said step of performing said planarizing process.

14. The method of claim 11 wherein said metal layer has a first thickness over said dielectric layer over an approximate center of said wafer and a second thickness over said dielectric layer at an edge of said wafer, wherein said first thickness is greater than said second thickness.

15. The method of claim 14 wherein said first thickness can be between 500.0 Angstroms and 3000.0 Angstroms greater than said second thickness.

16. The method of claim 11 wherein said planarizing process comprises a chemical mechanical polishing process.

17. The method of claim 11 wherein said step of forming said metal layer comprises using a plating process to deposit said metal layer.

18. The method of claim 17 wherein said plating process uses a plurality of virtual concentric electrodes situated adjacent to said wafer, wherein a current flow in each of said plurality of virtual concentric electrodes is controlled to cause said metal layer to be deposited with said dome-shaped profile.

19. The method of claim 11 wherein said metal layer comprises copper.

* * * * *